United States Patent [19]

Swirhun et al.

[11] Patent Number: 5,606,572
[45] Date of Patent: Feb. 25, 1997

[54] INTEGRATION OF LASER WITH PHOTODIODE FOR FEEDBACK CONTROL

[75] Inventors: Stanley E. Swirhun; William E. Quinn, both of Boulder, Colo.

[73] Assignee: Vixel Corporation, Broomfield, Colo.

[21] Appl. No.: 217,531

[22] Filed: Mar. 24, 1994

[51] Int. Cl.$^6$ .......................... H01S 3/18; H01L 31/153
[52] U.S. Cl. .................. 372/96; 572/50; 572/31; 257/84; 257/85
[58] Field of Search .................... 257/82, 84, 85, 257/88; 372/50, 43, 31, 96, 92, 99

[56] References Cited

U.S. PATENT DOCUMENTS

| | | | |
|---|---|---|---|
| 5,115,442 | 5/1992 | Lee et al. | 372/96 |
| 5,136,603 | 8/1992 | Hasnain et al. | 372/50 |
| 5,162,878 | 11/1992 | Sasagawa et al. | 257/98 |
| 5,317,170 | 5/1994 | Paoli | 372/50 |
| 5,331,654 | 7/1994 | Jewell et al. | 372/45 |

FOREIGN PATENT DOCUMENTS

| | | | |
|---|---|---|---|
| 1-61966 | 3/1989 | Japan | 257/84 |
| 2-151084 | 6/1990 | Japan | 257/84 |

*Primary Examiner*—Rodney B. Bovernick
*Assistant Examiner*—Robert McNutt
*Attorney, Agent, or Firm*—Irell & Manella LLP

[57] ABSTRACT

Photodiodes are integrally formed with vertical cavity surface emitting lasers (VCSELs) and superluminescent light emitting diodes (SLEDs) for monitoring optical radiation intensities. In different embodiments, the photodiode is epitaxially formed within a mirror of a VCSEL, non-epitaxially formed on top of a VCSEL, non-epitaxially formed on side of a VCSEL, or formed on the substrate on the side opposite the VCSEL. A lateral injection vertical cavity surface emitting laser is also disclosed for integration with a lateral PIN photodiode. A photodiode having the same epitaxial layers as a VCSEL is also integrally formed alongside of the VCSEL. Similar devices using SLEDs are also disclosed.

15 Claims, 12 Drawing Sheets

5,606,572

INTEGRATION OF LASER WITH PHOTODIODE FOR FEEDBACK CONTROL

FIELD OF THE INVENTION

This application relates to the integration of surface light emitting devices with photodetectors and, in particular, to monolithic integration of superluminescent light emitting diodes (SLEDs) or vertical cavity surface emitting lasers (VCSELs) with photodetectors for feedback control of the radiation intensity of the SLEDs or VCSELs.

BACKGROUND OF THE INVENTION

Semiconductor lasers are widely used in applications such as optical communications and compact disk players, etc. In those applications, the optical intensity of the lasers is usually monitored for any intensity variation due to changing of the environment (e.g. temperature), heat generated by the laser circuitry, long-term drift of the laser properties, or drift of the properties of the circuitry that drives the laser. Generally, for conventional edge-emitting lasers, the intensity of the laser is monitored by a separate photodetector installed in the vicinity of the laser. The photodetector receives a small portion of the total optical radiation emitted from the laser and generates a feedback signal that corresponds to the intensity of the emitted radiation. This feedback signal is then provided to a feedback circuit that sends a control signal to the circuit that provides current to the laser. Accordingly, any drift of the laser intensity is detected and compensated by adjusting the current applied to the laser. In digital applications wherein the laser is modulated by a series of current pulses, the photodetector is also used to verify the output optical pulses against the input of the electrical pulses.

A new class of semiconductor lasers, vertical cavity surface emitting lasers (VCSELs), has been developed. Unlike conventional edge emitting lasers that emit light in a direction parallel to the semiconductor substrates where the lasers are formed, a VCSEL has an optical cavity perpendicular to the substrate and emits optical radiation in a direction perpendicular to the substrate. Because of this structure, a VCSEL is more readily integrated with a photodiode than a conventional edge emitting laser.

In an article "Monolithic Integration of Photodetector with Vertical Cavity Surface Emitting Laser," *Electronic Letters*, Vol. 27, No. 18, pp.1630–1632 (1991), Hasnain et al. disclose an integrated device comprising a VCSEL and a PIN photodiode. In this device, the VCSEL is epitaxially formed on a semiconductor substrate and the PIN photodiode is epitaxially formed on the VCSEL. When operating, the VCSEL emits optical radiation which traverses the PIN photodiode. Accordingly, the photodiode absorbs a small portion of the optical radiation and generates a photocurrent which corresponds to the intensity of the radiation. However, in this device, the PIN photodiode undesirable reflects and absorbs a portion of the light emitted from the VCSEL, which compromises the optical efficiency of the VCSEL.

It is therefore an object of the present invention to develop an integrated optoelectronic device comprising a VCSEL and a photodiode without compromising the optical efficiency of the VCSEL.

Certain semiconductor diodes known as superluminescent light emitting diodes (SLEDs) also emit radiation in a direction perpendicular to the plane of the p-n junction. These SLEDs have a construction that is similar to that of a VCSEL except that one of the mirrors either is absent or has reduced reflectance such that the threshold conditions for lasing cannot be achieved.

It is yet another object of the invention to monolithically integrate SLEDs with photodiodes in various structures.

SUMMARY OF THE INVENTION

In one embodiment of the invention, an integrated optoelectronic device comprises a vertical cavity surface emitting laser (VCSEL) and a photodiode. The VCSEL comprises first and second mirrors forming therebetween an optical cavity perpendicular to a substrate where the VCSEL is formed, and an active region disposed between the mirrors. The photodiode is formed within the second mirror. Advantageously, the photodiode comprises a plurality of semiconductor layers which also form a portion of the second mirror. Therefore, the photodiode is integrated with the VCSEL without introducing any undesirable optical perturbation from the photodiode. The photodiode comprises materials having an energy bandgap equal to or smaller than the energy bandgap corresponding to the optical radiation, so that the photodiode intercepts and absorbs at least a portion of the optical radiation and generates a corresponding electrical signal.

Preferably, the second mirror is an epitaxially formed semiconductor distributed Bragg reflector (DBR) comprising a plurality of alternating semiconductor layers having high and low indices of refraction, with each layer having a thickness of $\lambda/4n$ where $\lambda$ is the wavelength of the optical radiation emitted from the laser and n is the index of refraction of the layer. The photodiode is a PIN photodiode that comprises an undoped region interposed between a p-type region and an n-type region. Accordingly, each of the regions that form the PIN photodiode includes at least one of the layers that forms the second mirror.

In another embodiment of the invention, an integrated optoelectronic device comprises a substrate, a surface light emitting device formed on the substrate, the device emitting optical radiation having a wavelength, $\lambda$, and a photodiode non-epitaxially formed on the surface emitting device. The surface light emitting device may be a SLED or a VCSEL. In the case of a VCSEL, the VCSEL comprises first and second mirrors which form therebetween a vertical optical cavity, and an active region disposed between the mirrors. The photodiode is non-epitaxially formed over the second mirror of the VCSEL. The second mirror of the laser can be a semiconductor DBR or a dielectric DBR. Preferably, the photodiode is a polysilicon PN photodiode comprising a p-type polysilicon layer formed over an n-type polysilicon layer. The photodiode receives optical radiation emitted from the VCSEL and generates a signal which corresponds to the intensity of the radiation. In the case of a SLED, the structure of the device is the same except that one of the mirrors either is absent or has reduced reflectance.

In another embodiment, an integrated optoelectronic device comprises a VCSEL formed on a first surface of a substrate and a photodiode non-epitaxially formed on a second surface of the substrate. The photodiode is substantially vertically aligned to the VCSEL for receiving optical radiation emitted from the laser.

In another embodiment, an integrated optoelectronic device comprises a semiconductor substrate, a surface light emitting device having a light-generating region formed on the substrate, at least the light-generating region forming a mesa having a substantially vertical outer surface, and a photodiode formed over the vertical outer surface of the mesa. The surface light emitting device emits a first optical radiation substantially orthogonal to the substrate, and a second optical radiation substantially parallel to the substrate. The photodiode receives the second optical radiation and generates a corresponding electrical signal.

The surface light emitting device may be a SLED or a VCSEL. When the surface light emitting device is a VCSEL, it is formed on a substrate and a photodiode non-epitaxially formed on the side of the laser. Specifically, the VCSEL includes first and second mirrors that form a vertical optical cavity, and an active region disposed between the mirrors. A mesa that includes at least the second mirror and the active region is formed. The mesa has a sidewall which has a vertical outer surface. Accordingly, the photodiode is formed on at least a portion of the outer surface of the mesa. The photodiode receives lateral optical radiation from the active region of the VCSEL and generates a corresponding feedback signal. In the case of a SLED, the structure of the device is the same except that one of the mirrors either is absent or has reduce reflectance.

In another embodiment, an integrated optoelectronic device comprises a VCSEL epitaxially formed on a first surface of a substrate and an implanted photodiode formed within the substrate and at a second surface of the substrate. The implanted photodiode is vertically aligned with the VCSEL and receives optical radiation emitted from the laser. Preferably, the implanted photodiode is a PN photodiode comprising an implanted p-type region formed in an n-type substrate.

In another embodiment, an integrated optoelectronic device comprises a lateral injection VCSEL and a lateral PIN photodiode. The lateral injection VCSEL comprises first and second mirrors and an active region disposed between the mirrors. Additionally, the laser further contains a first implantation region having a first conductivity type and a second implantation having a second conductivity type. Both the first and second implanted regions are formed at the periphery of the active region for applying a current to the active region. The device further includes a third implantation region having a first conductivity type formed at the periphery of the active region; and the first, second, and third implantation regions do not overlap each other. Accordingly, the third implantation region, active region, and second implantation region together form a PIN photodiode, whereby a voltage between the second and third implantation regions indicates the intensity of the optical radiation emitted from the laser.

Alternatively, in addition to the first, second, and third implantation regions, a fourth implantation region having a second conductivity type is formed at the periphery of the active region. Accordingly, the first and second implantation regions are utilized to inject current into the active region, whereas the third and fourth implantation regions and the active regions form the PIN photodiode.

Finally, in another embodiment, an integrated optoelectronic device comprises a substrate having a first conductivity type, a first mirror having a first conductivity type formed on the substrate, a first undoped spacer formed on the first mirror, an active region formed on the first spacer, a second undoped spacer formed on the active region, and a second mirror having a second conductivity type formed on the second spacer. The device further includes an implanted isolation region formed within at least the second mirror, the spacers and the active region. The implanted isolation region extends vertically from the second mirror to the first mirror, thereby dividing the second mirror, active region, and spacers into two portions, a first portion which is a VCSEL, and a second portion which is a PIN photodiode. The PIN photodiode receives a laterally emitted optical radiation from the active region of the laser and generates a corresponding signal. The isolation region separates the laser and the PIN photodiode so that a voltage applied to the photodiode does not affect the laser.

BRIEF DESCRIPTION OF THE DRAWINGS

These and other features, objects, and advantages of the present invention will become more apparent from the detailed description in conjunction with the appended drawings in which:

FIG. 1b illustrates, in more detail, a portion of the PIN photodiode of FIG. 1a;

FIG. 1c depicts an alternative embodiment of the VCSEL of FIG. 1a.

FIG. 2a shows an equivalent circuit diagram of the integrated optoelectronic device of FIG. 1a;

FIG. 2b illustrates an exemplary circuit configuration utilizing the device shown in FIG. 1a;

FIG. 2c is a circuit diagram of feedback control of the laser intensity using the device shown in FIG. 1a;

FIG. 3b is a more detailed illustration of a portion of the PN photodiode shown in FIG. 3a;

FIG. 9d depicts a top view of an alternative embodiment of the device shown in FIG. 9a;

FIG. 9e depicts a top view of another alternative embodiment of the device shown in FIG. 9a;

FIG. 10b illustrates a cross-section of the VCSEL shown in FIG. 10a;

FIG. 10c depicts a cross-sections of the VCSEL and the PIN photodiode shown in FIG. 10a; and FIG. 10d is an equivalent circuit diagram of the device shown in FIG. 10a.

DETAILED DESCRIPTION

In accordance with the invention, an optoelectronic device is disclosed comprising a vertical cavity surface emitting laser (VCSEL) or a superluminescent light emitting diode (SLED) and a photodiode which is integrally formed with the VCSEL or SLED. When in operation, the VCSEL or SLED emits optical radiation, and the photodiode intercepts the radiation and generates a feedback signal that corresponds to the intensity of the radiation.

In one embodiment, an integrated optoelectronic device comprises a VCSEL formed on a substrate and a photodiode formed in a mirror of the laser. The mirror is a semiconductor DBR comprising epitaxially formed layers having alternating high and low indices of refraction. Advantageously, the photodiode is at least a portion of the mirror and is an integral part of the VCSEL. As a result, the device of the present invention offers improved optical efficiency as compared with prior art devices.

The photodiode is a PIN photodiode or a PN photodiode. The photodiode comprises semiconductor materials having a smaller bandgap than the effective bandgap of an active region of the VCSEL for absorbing the emitted light.

Figure 1A:
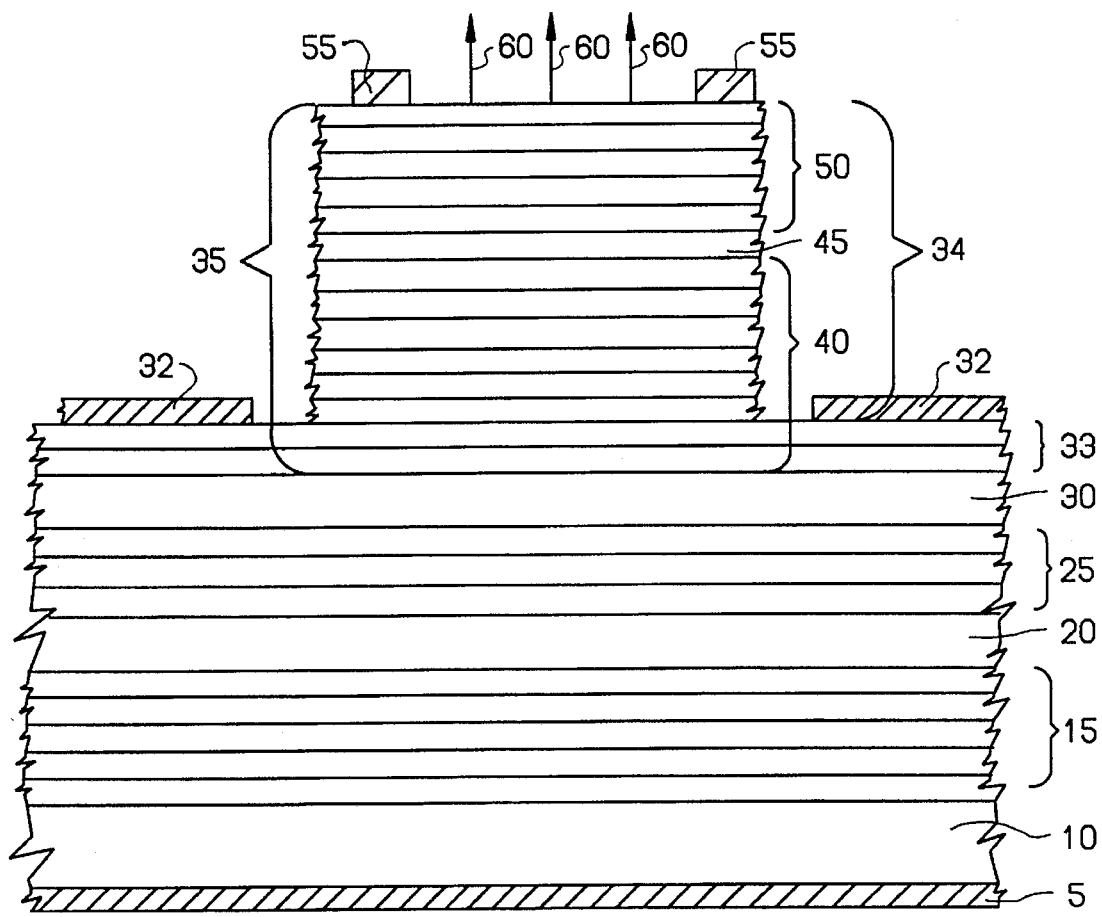
FIG. 1a depicts a cross-sectional view of a VCSEL integrated with a PIN photodiode epitaxially formed in a mirror of the VCSEL.

FIG. 1a illustrates a cross-sectional view of a preferred embodiment of the device. It comprises an n-type first mirror 15, a first spacer 20, an active region 25 comprising AlGaAs/GaAs quantum wells, a second spacer 30, and a second mirror 35 formed on one side of an n-type GaAs substrate 10. Alternatively, the active region comprises InGaAs/GaAs quantum wells.

Second mirror 35 has two portions, a mesa portion 34, and a contact portion 33. Preferably, contact portion 33 is doped to have a p-type conductivity to provide an ohmic contact with contact 32. Contact 5 for the substrate is formed on the other side of the substrate.

Illustratively, lower mirror 15 is an n-doped semiconductor DBR comprising 20–30 periods of AlAs/AlGaAs layers. Each of these AlAs and AlGaAs layers has a thickness of $\lambda/(4n)$ where $\lambda$ is referred hereinafter as the wavelength of the emitted optical radiation in free space and n is the index of refraction of the layer.

Second mirror 35 is also a semiconductor DBR comprising alternating semiconductor layers of high and low indices of refraction. The layers that form the second mirror are doped so that they form the PIN photodiode.

Figure 1B:
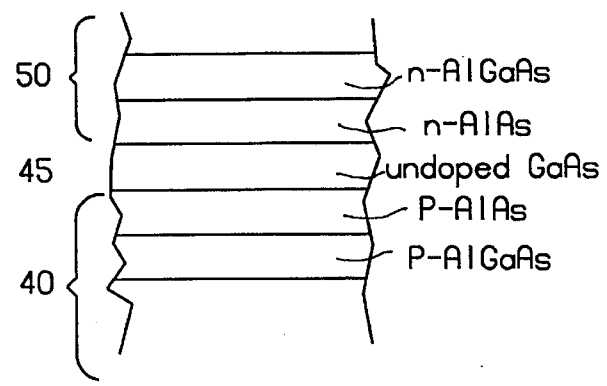

Specifically, as shown in FIG. 1b, second mirror comprises three portions, a lower p-type portion 40, an undoped layer 45, and an upper n-type portion 50. Lower portion 40 comprises p-doped alternating layers of AlAs and AlGaAs, each layer having a thickness of $\lambda/(4n)$. Layer 45 is an undoped GaAs layer having a thickness of $\lambda/(4n)$. Portion 50 comprises n-doped alternating layers of AlAs and AlGaAs, each layer having a thickness of $\lambda/(4n)$. Thus, portions 40, 45, and 50 form a PIN diode. GaAs layer 45 in the PIN photodiode has a smaller bandgap than the effective bandgap of the active region for absorbing a portion of radiation emitted from the laser. Alternatively, if the active region comprises InGaAs/GaAs quantum wells, layer 45 is an InGaAs layer having an effective bandgap no greater than that of the active region for absorbing the optical radiation. Illustratively, optical radiation 60 is emitted through the second mirror and the PIN photodiode absorbs a small portion of the radiation.

In FIG. 1b, the undoped portion of the PIN photodiode is a single layer having a thickness of $\lambda/(4n)$. Alternatively, this undoped portion can consist of more than one layer, each layer having a thickness of $\lambda/(4n)$.

Figure 2A:
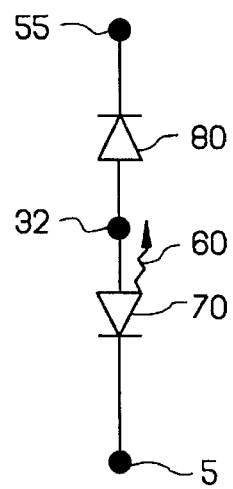

FIG. 2a depicts an equivalent circuit diagram of the device shown in FIG. 1a. In FIG. 2a, a VCSEL 70 is serially connected with PIN photodiode 80. The VCSEL and photodiode anodes are common.

Figure 2B:
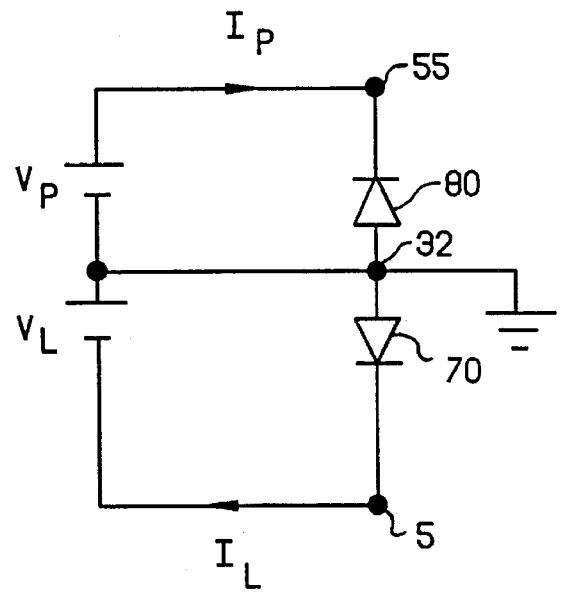

FIG. 2b depicts one of the possible configurations for utilizing the PIN photodiode to detect the radiation emitted from the VCSEL. In this configuration, contact 32 is grounded. A positive voltage $V_L$ is applied between contacts 32 and 5 to generate current $I_L$ which causes VCSEL 70 to radiate. PIN diode 80 is reversed biased by applying a positive voltage $V_P$ between contacts 55 and 32. The light emitted from the VCSEL generates a photocurrent $I_P$ which corresponds to the intensity of the emitted radiation. This photocurrent can be utilized as a signal for feedback control of the VCSEL intensity or as an indicator of the VCSEL intensity.

Figure 2C:
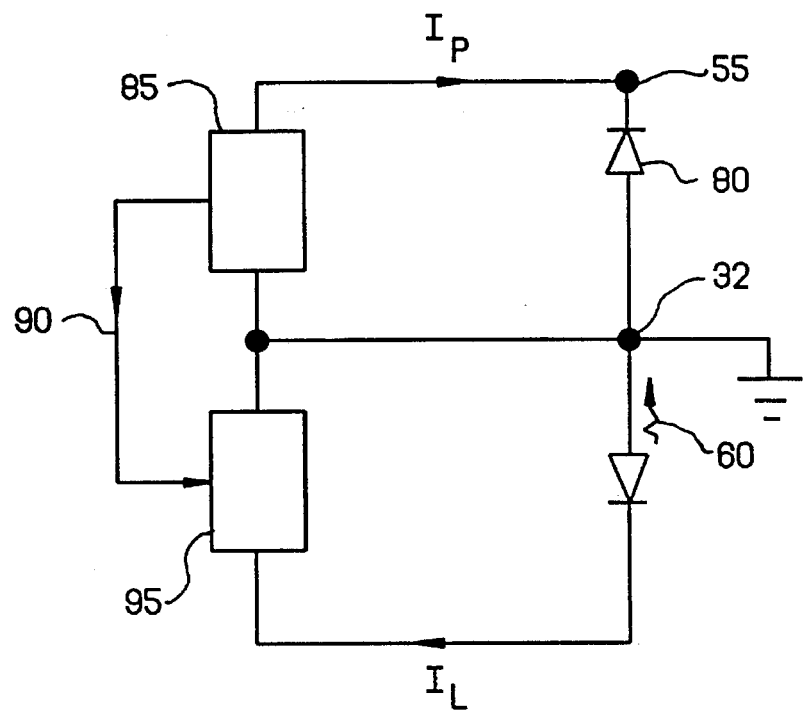

FIG. 2c illustrates a schematic diagram of a circuit for using the PIN photodiode for feedback control of the VCSEL intensity. As shown in this figure, photocurrent $I_P$ is sent to a feedback circuit 85 which generates a signal 90 that corresponds to photocurrent $I_P$. Signal 90 is then sent to a laser controller 95. The laser controller then adjusts a laser driving current. $I_n$ in response to feedback signal 90 so as to maintain a constant magnitude of VCSEL intensity.

Instead of photocurrent, a photovoltage generated from the photodiode can also be utilized as the feedback signal that relates to the intensity of the radiation. Additionally, instead of grounding contact 32, contacts 5 and/or 55 may be grounded.

The integrated optoelectronic device as shown in FIG. 1a is fabricated similarly to conventional VCSELs. All semiconductor layers, including layers for the first and second mirrors, the first and second spacers, and the active region, are epitaxially formed on a semiconductor substrate. Typically, Molecular Beam Epitaxy (MBE) or Metal Organic Chemical Vapor Deposition (MOCVD) technology is employed to epitaxially form these layers. Subsequently, the mesa portion of the second mirror is defined by etching the portion of the layers in region that surrounds the mesa. Contact 5 for contacting n-doped substrate 10 and contact 32 for contacting p-doped mirror portion 33 are also formed; and a ring-shaped contact 55 is formed on top of second mirror 35 to contact upper portion 50 of the PIN photodiode. Note that contacts 5 and 55 are contacts for n-doped semiconductor material, whereas contact 32 is a contact for p-type semiconductor material.

Various other device structures or materials that are typically utilized in conventional VCSELs can also be incorporated in this device. For example, portions 50 and 40 of the second mirror can be formed by depositing alternating layers of $Al_{(1-x)}Ga_xAs$ and $Al_{(1-y)}Ga_yAs$ where x and y are different values; or an annular p-type implanted region can be formed in the second spacer under contact 32 for reducing the contact resistance.

Figure 1C:
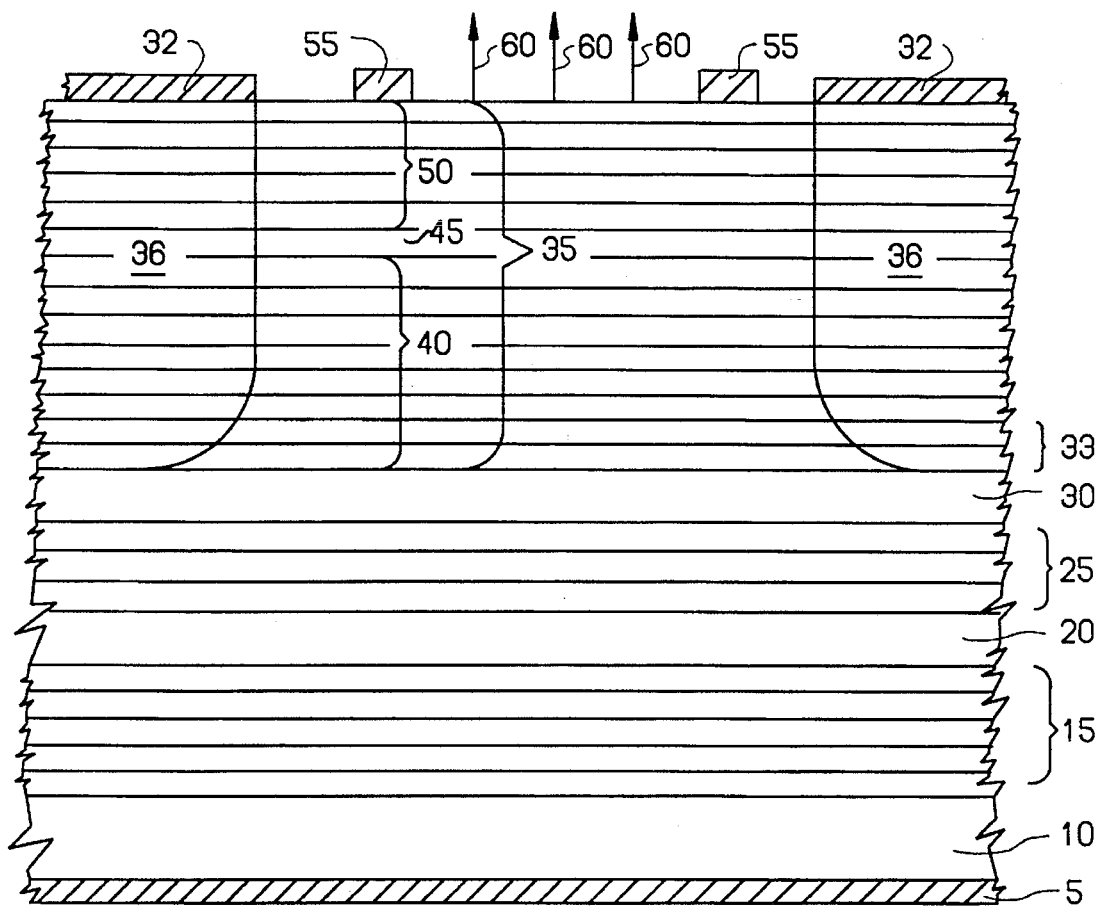

Alternatively, as illustrated in FIG. 1c, instead of removing portions of the layers of the second mirror to form the mesa structure, the planar structure formed by deposition of the layers of the VCSEL can be left in place and an annular implantation region 36 can be formed in the planar structure. Implantation region 36 should have a p-type conductivity type and extend vertically downward at least to the layer in p-type portion 40 of mirror 35. In this structure, contact 32 is formed on the surface of the implantation region and therefore is co-planar with contact 55. Preferably, the implantation region should extend to second spacer 30 to reduce serial resistance of the laser.

Figure 3A:
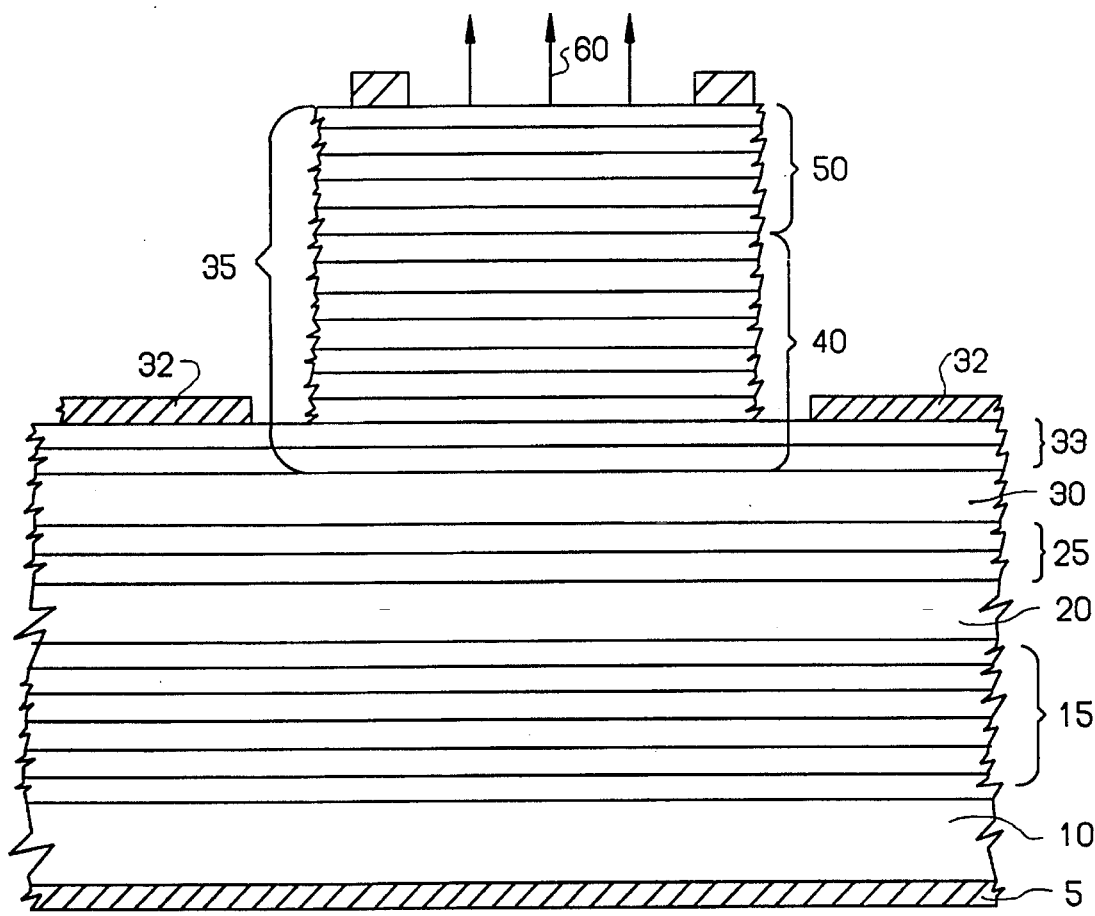
FIG. 3a illustrates a cross-section of a VCSEL integrated with an epitaxially formed PN photodiode.

In another embodiment of the invention, a PN photodiode is formed in a mirror of a VCSEL. The cross-section of a preferred embodiment of this integrated optoelectronic device is illustrated in FIG. 3a. Since this device is very similar to the above described device wherein the detector is a PIN photodiode, like elements are designated with the same number in FIGS. 3a and 3b for convenience.

Figure 3B:
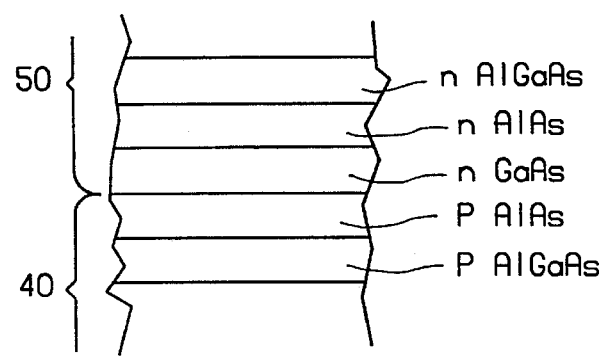

As shown in FIG. 3a, second mirror 35 comprises two portions, a p-type portion 40 and an n-type portion 50 that is formed on the p-type portion. In order to absorb a portion of the emitted radiation, at least one of the layers at the interface of portions 40 and 50 should be a semiconductor layer having a bandgap equal or smaller than the effective bandgap of the active region. As illustrated in FIG. 3b, the two layers adjacent to the interface between p-type portion 40 and n-type portion 50 are a p-type AlAs layer and an n-type GaAs layer. These two layers form a PN junction.

Illustratively, portion 40 comprises alternating p-type layers of AlAs and AlGaAs, and portion 50 comprises an n-type GaAs layer formed on portion 40 and alternating n-type layers of AlAs and AlGaAs formed on the GaAs layer.

The rest of the embodiment of FIG. 3a is the same as the embodiment shown in FIG. 1a and is not described here.

In another embodiment of the invention, an integrated optoelectronic device comprises a surface light emitting device such as a SLED or a VCSEL and a photodiode non-epitaxially formed on the surface light emitting device. This non-epitaxially formed photodiode intercepts optical radiation emitted from the device and produces a feedback signal that corresponds to the intensity of the radiation.

Figure 4:
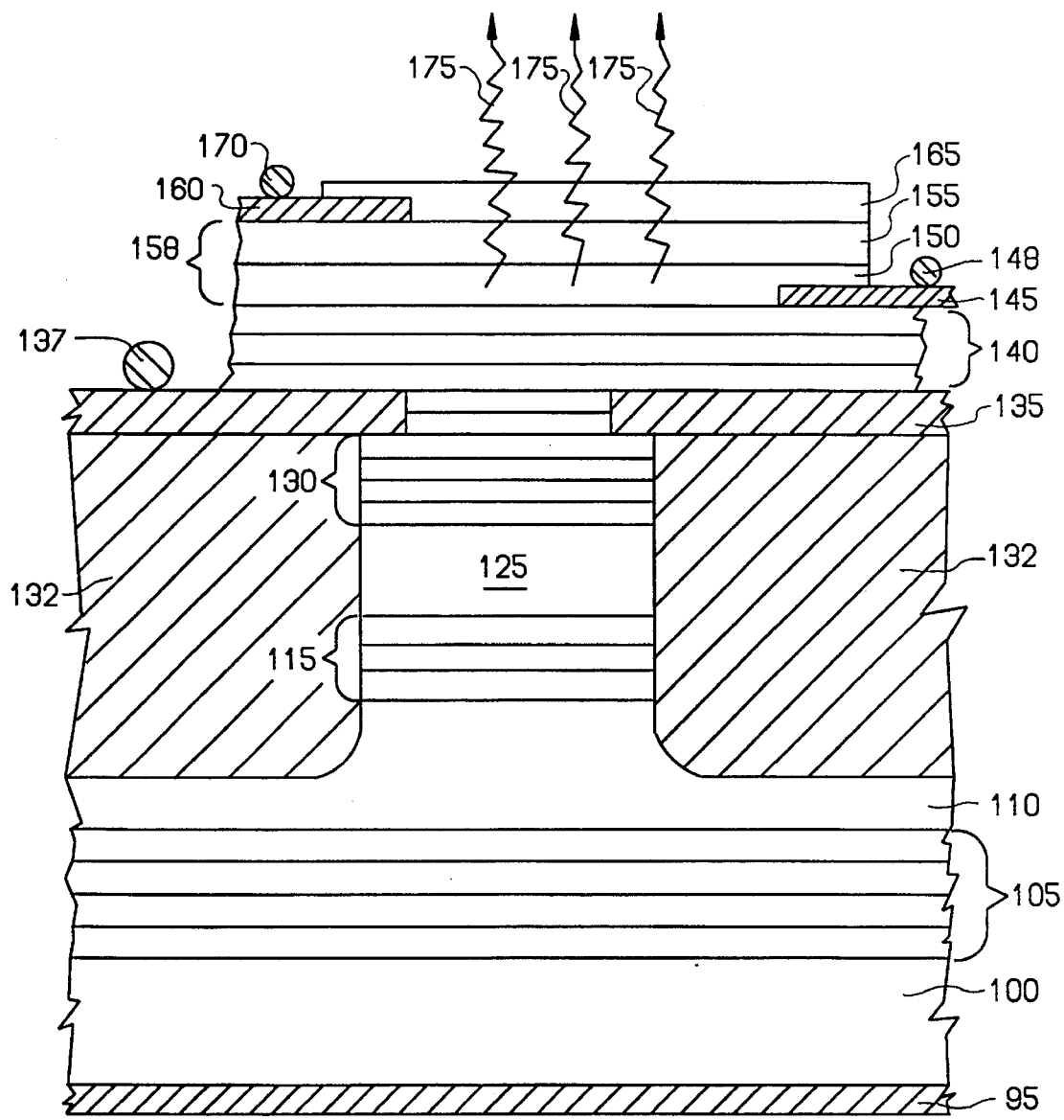
FIG. 4 depicts a cross-section of a VCSEL integrated with a non-epitaxially formed PN photodiode.

FIG. 4 illustrates a preferred embodiment wherein the surface light emitting device is a VCSEL. The device comprises an n-type GaAs substrate 100, a first mirror 105 formed on the substrate, a first spacer 110, an active region 115 formed on the first spacer, a second spacer 125 formed on the active region, a first portion of a second mirror 130, a second portion of the second mirror 140, a polysilicon PN photodiode 158, and a protection layer 165 formed on the PN photodiode. This device further includes an implanted annular current confinement region 132, an annular p-contact 135, contacts 145 and 160 for contacting the photodiode, and contact 95 for contacting the n-doped substrate.

Illustratively, first mirror 105 is a semiconductor DBR comprising 20-30 periods of AlAs/AlGaAs layers. Each of the AlAs or AlGaAs layers has a thickness of $\lambda/(4n)$. In addition, the first mirror is doped to have n-type conductivity.

Active region 115 comprises at least one GaAs quantum well. Preferably, the two spacers 110, 125 surrounding the active region are un-doped or low doped.

The first portion of the second mirror 130 is a p-type semiconductor DBR. Since the first portion is mainly used to provide ohmic contact with p-type contact 135, it typically contains only a few layers. Preferably, the first portion comprises approximately one to three periods of AlAs/AlGaAs layers, each AlAs or AlGaAs layer being $\lambda/(4n)$ thick. In addition, this first portion is doped to have p-type conductivity to assure ohmic contact with contact 135. Advantageously, since this first portion only contains a few layers, it is doped with p-dopant to a very high doping density (e.g., $10^{18}$–$10^{20}$/cm$^3$) without significantly compromising the optical characteristics of the VCSEL.

The second portion of the second mirror is a dielectric DBR comprising alternating layers of $SiO_2$ 80 /and $Si_3N_4$, each of the layers having a thickness of $\lambda/(4n)$. Thus, the first and second portions of the second mirror form the second mirror of the VCSEL. Accordingly, the first and second mirrors form therebetween a vertical optical cavity.

Current confinement region 132 is an annular region peripherally formed around the active region, the second spacer, the first portion of the second mirror, and a part of the first spacer. It is formed by implanting conductivity reducing ions such as Argon (Ar) or Helium (He). Consequently, this region exhibits high resistivity compared with its neighboring regions.

Contact 135 is used to contact p-doped portion 130. Illustratively, it comprises gold-beryllium (AuBe) or gold-zinc (AuZn) alloys. The substrate contact 95 is formed to make ohmic contact to the n-type GaAs substrate and illustratively comprises gold-germanium alloy (AuGe).

Polysilicon photodiode 158 is formed on the second mirror. It comprises a p-type polysilicon layer 150, and a n-type polysilicon layer 155 formed on the p-type layer. Two peripheral contacts are formed to contact the two polysilicon layers. Illustratively, contact 160 is peripherally formed on the n-doped layer for contacting the n-type polysilicon layer 155, and contact 145 is peripherally formed under the p-doped layer for contacting the p-doped layer 150. Preferably, both contacts 145 and 160 are titanium silicide. Protection layer 165 is a $SiO_2$ layer formed on the photodiode.

The fabrication of this device begins with sequentially growing the layers that form the first mirror, the first spacer, the active region, the second spacer, and the first portion of the second mirror. Next, the current confinement region is formed by performing an annular implantation of Argon or Helium. The implanted region is damaged by the implantation so it has a substantially higher resistivity than the non-implanted regions. Therefore, current applied between contacts 135 and 95 is substantially confined to the active region. After the implantation process, contact 135 is formed by depositing a layer of gold-beryllium alloy and removing portions of the layer to define the shape of contact 135.

Subsequently, the second portion of the second mirror is formed by depositing alternating layers of $Si_3N_4$ and $SiO_2$. The deposition of $Si_3N_4$ and $SiO_2$ layer is well-known and is accomplished through techniques such as sputtering or chemical vapor deposition (CVD).

Following the formation of the second mirror, a layer of titanium (Ti) is uniformly deposited onto the second mirror and etched to form contact 145. Next, the polysilicon PN diode is formed by first depositing p-doped polysilicon layer 150 and then n-doped polysilicon layer 155. Layers 150 and 155 form a PN junction.

Subsequently, contact 160 is formed by depositing another layer of titanium (Ti) and etching. Then, protective layer 165 is formed by depositing a layer of $SiO_2$. Etching is subsequently performed to expose portions of contacts 160 and 145 so that they can be contacted by bonding wire 170 and 148.

The structure is subsequently annealed so that contacts 145 and 160 titanium react with the polysilicon layers to form titanium-silicide. These titanium silicide layers form low-resistance ohmic contacts with layers 150 and 155, respectively. Typically, the annealing temperature is between 400° to 500° C. and the annealing time is about 30 minutes. The thickness of Ti layers 145 and 160 should be judiciously chosen so that they only form silicide within the layer they intend to contact. The formation of a silicide contact to a polysilicon layer is a well-developed technique in silicon semiconductor technology and therefore is not discussed in detail here.

Finally, contact 95 on n-type GaAs is formed by depositing a layer of Ni and AuGe on substrate 100 and annealing.

In this device, when an electrical current is applied between contacts 135 and 95, optical radiation 175 is emitted from the laser. If the applied current exceeds the threshold current of the laser, coherent optical radiation 175 is generated. Optical radiation 175 traverses polysilicon PN photodiode 158 which is reverse biased. Since the bandgap of polysilicon is smaller than the effective bandgap of the active region, a portion of the emitted radiation is absorbed by the polysilicon PN photodiode. Consequently, the PN photodiode produces a photocurrent that corresponds to the intensity of emitted radiation. Such current can be utilized as a feedback signal for controlling the intensity of radiation 175.

An alternative way to contact polysilicon layer 150 is to form contact 145 peripherally on layer 150, instead of forming it under layer 150. The process to fabricate such structure includes forming polysilicon layers 150 and 155 onto the second mirror prior to forming contact 145. Subsequently, layer 155 is peripherally etched to expose a portion of layer 150. Contact 145 is then formed on this exposed area of layer 150.

Figure 5:
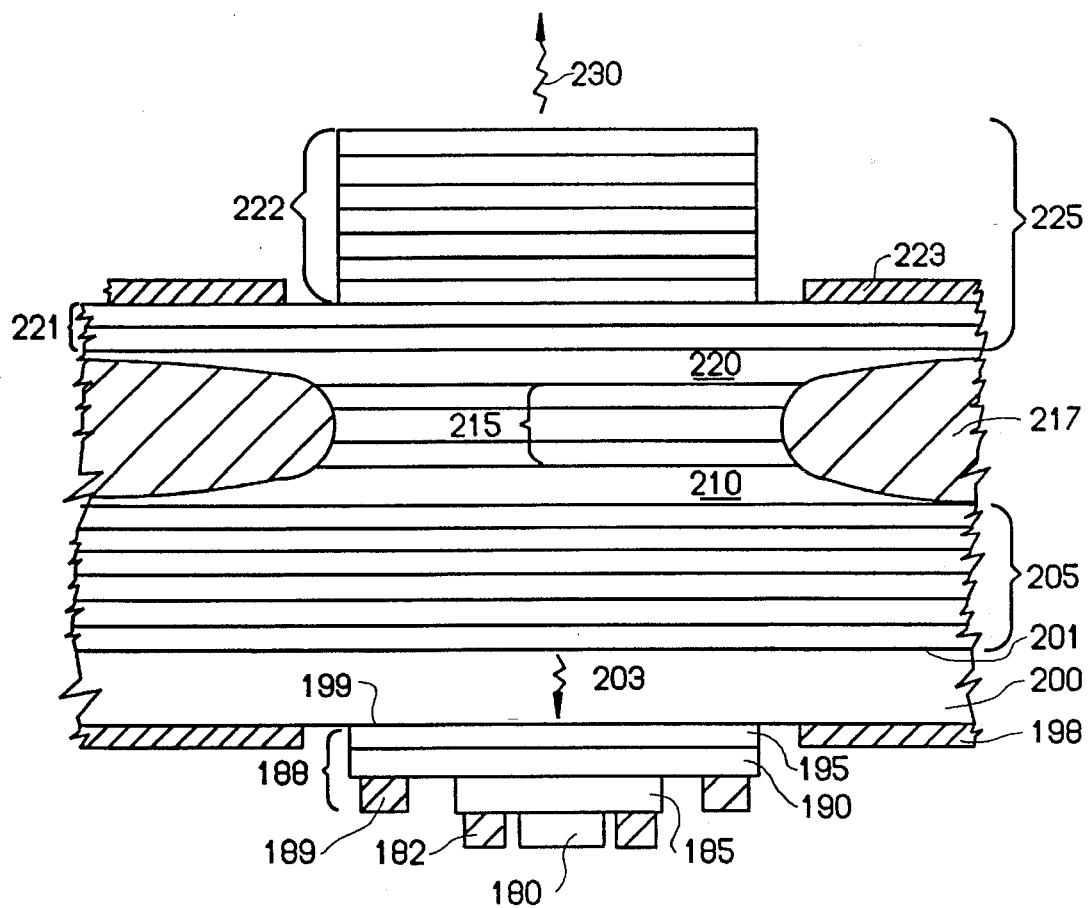
FIG. 5 illustrates a cross-section of a VCSEL integrated with a non-epitaxially formed PN photodiode formed on a back surface of a substrate.

In another embodiment, as shown in FIG. 5, an integrated optoelectronic device comprises a VCSEL formed on a first surface of a substrate and a PN photodiode 188 non-epitaxially formed on a second surface of the substrate. Additionally, the PN photodiode is vertically aligned with the VCSEL. Thus, the PN photodiode intercepts optical radiation 203 emitted from the VCSEL and produces a current or voltage which corresponds to the intensity of radiation 230. Such current or voltage can be used as a feedback signal for controlling the intensity of radiation 230.

Illustratively, the VCSEL comprises a first mirror 205 formed on a first surface 201 of substrate 200, a first spacer 210 formed on the first mirror, an active region 215 formed on the first spacer, a second spacer 220 formed on the active region, and a second mirror 225 formed on the second spacer. An isolation layer 195 is formed on second surface 199 of the substrate. The PN photodiode comprises a p-type polysilicon layer 190 non-epitaxially formed on the isolation layer, and a n-type polysilicon layer 185 non-epitaxially formed on the p-type polysilicon layer. Preferably, a protective $SiO_2$ layer 180 is formed on the n-type polysilicon layer.

In the VCSEL, first mirror 205 and second mirror 225 form therebetween a vertical optical cavity. First mirror 205 is partially transmissive to allow radiation 203 to reach the photodiode. Preferably, to reduce absorption due to the substrate, radiation 203 has a wavelength corresponding to an energy bandgap that is not greater than that of the substrate. This can be achieved by forming the active region so that it has an effective energy bandgap that is not greater than that of the substrate. Alternatively, the substrate can be thinned to minimize absorption effects. Preferably, radiation 203 is only a portion of the total optical radiation emitted from the laser; for example, it is approximately 10% of the total radiation, whereas radiation 230 is about 90% of the total radiation.

First mirror 205 is a semiconductor DBR comprising a plurality of alternating layers of AlGaAs and AlAs, each of AlGaAs or AlAs having a thickness of $\lambda/(4n)$. The number of periods of AlGaAs/AlAs layers and the lasing wavelength are judiciously chosen so that about 10% of total radiation transmits through the mirror 205.

Preferably, active region 215 comprises one or more GaAs quantum wells and has an effective bandgap smaller than that of GaAs substrate 200. As result, radiation 203 goes through the substrate and reaches the photodiode without suffering significant attenuation in the substrate.

In the case when the active region comprises one or more GaAs/AlGaAs quantum wells, GaAs substrate 200 may be required to have a thickness of less than 100 μm. This reduces the absorption of radiation 203 in the substrate, so radiation 203 has the desired intensity when it reaches the photodiode.

The active region is laterally defined by an annular implanted current confinement region 217 which has substantially higher resistivity than the active region. The current confinement region includes peripheral portions of spacers 210 and 220.

Second mirror 225 comprises two portions, a first portion 221 and a second portion 222. First portion 221 is a semiconductor DBR comprising one or more periods of AlGaAs/AlAs layers, each of the AlGaAs or AlAs layer having a thickness of $\lambda/4n$. Additionally, the first portion of the second mirror is doped with p-type dopants to provide an ohmic contact with contact 223.

Second portion of the second mirror 222 is a dielectric DBR, or a semiconductor DBR. Preferably, portion 222 is a dielectric Bragg reflector comprising a plurality of alternating layers of $Si_3N_4$ and $SiO_2$, each of the $Si_3N_4$ or $SiO_2$ layer having a thickness of $\lambda/4n$.

As illustrated, contacts 198, 189, and 182 are formed to provide electrical contact to the substrate and the photodiode, respectively.

To fabricate this device, epitaxial layers forming the first mirror, the spacers, the active region and the first portion of the second mirror are first grown on the first Surface of the GaAs substrate. Subsequently, current confinement region 217 is formed by an annular implantation of Ar ions. Next, the second portion of the second mirror is constructed by depositing a series of alternating layers of $SiO_2$ and $Si_3N_4$ onto the first portion of the second mirror. The deposition is conventionally accomplished by sputtering or other techniques.

Next, isolation layer 195 is formed by depositing a layer of $SiO_2$ onto the back surface of the substrate. The polysilicon PN photodiode is then constructed by depositing first a p-type polysilicon layer and then a n-type polysilicon layer. The polysilicon layers are formed by conventional Low Pressure Chemical Vapor Deposition (LPCVD) or evaporation. Subsequently, a $SiO_2$ protection layer is formed on the exposed polysilicon layer.

Next, mesa etching is performed to define the second portion of the second mirror and to expose an annular area of the first portion of the second mirror for formation of contact 223. Similarly, etching is also performed to expose peripheral areas of the substrate, the p-type polysilicon layer, and the n-type polysilicon layer. Finally, contacts for the laser and the polysilicon PN photodiode are formed on those exposed areas.

In the preferred embodiment, the polysilicon photodiode is vertically aligned to the active region to receive maximum optical radiation emitted toward the photodiode.

In another embodiment, an integrated optoelectronic device comprises a surface light emitting device having a mesa, and a photodiode formed on the sidewall of the mesa. The surface light emitting device may be a SLED or a VCSEL. The photodiode intercepts optical radiation laterally emitted from the surface light emitting device through the sidewall and provides a feedback signal that corresponds to the intensity of total radiation.

Figure 6:
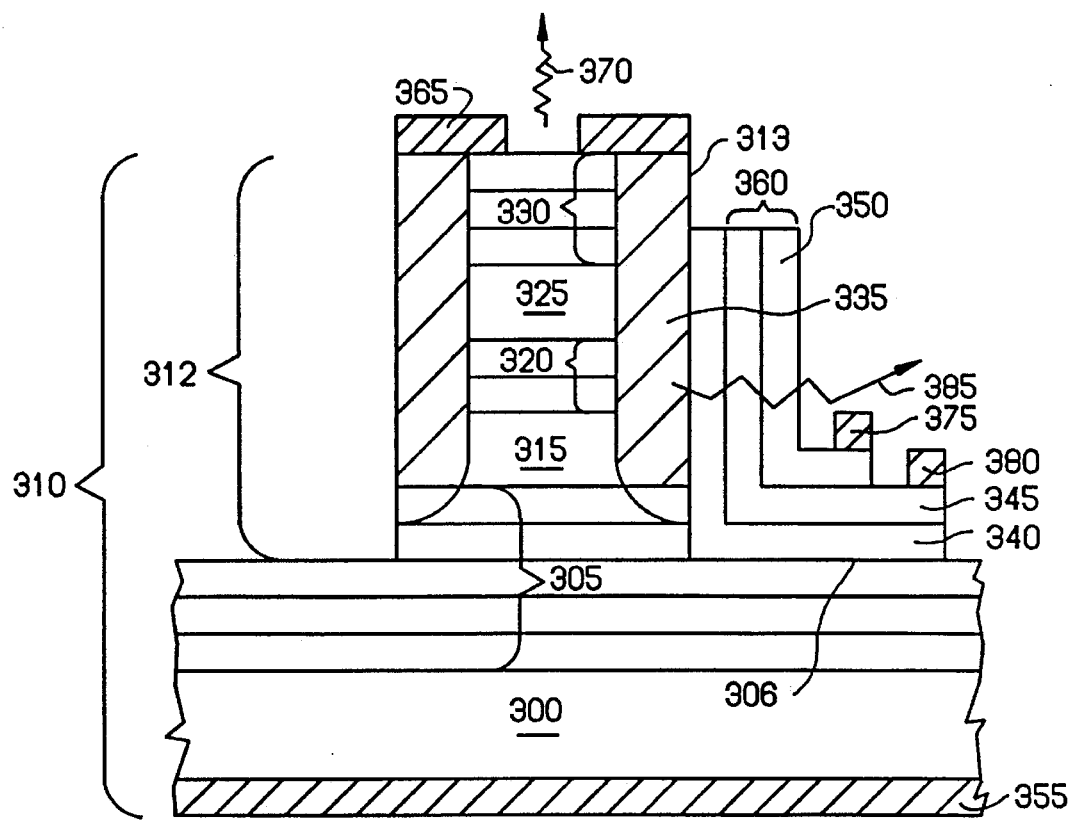
FIG. 6 depicts a cross-section of a VCSEL integrated with a PN photodiode non-epitaxially formed on the side of a mesa of the VCSEL.

As illustrated in FIG. 6, the preferred embodiment of such integrated optoelectronic device comprises a VCSEL 310 having a mesa 312 and a polysilicon photodiode formed on a sidewall 313 of the mesa. More specifically, the VCSEL comprises a substrate 300, a first mirror 305, a first spacer 315, an active region 320, a second spacer 325, and a second mirror 330. Additionally, the VCSEL further includes a peripheral contact 365 formed on the second mirror and a substrate contact 355. An annular current confinement region 335 is formed to confine current applied to the VCSEL to the central portion of the VCSEL.

When a current is applied to the VCSEL through contacts 355 and 365, optical radiation is emitted from the VCSEL. Preferably, most of the radiation is emitted through the second mirror. Such radiation is designated as 370 in the Figure. However, a small portion of the total radiation is laterally emitted through the side wall of the mesa. This portion of radiation is designated as 385 in the Figure. Advantageously, photodiode 360 intercepts radiation 385 and generates a feedback signal that relates to the intensity of radiation 370.

Preferably, the photodiode is a polysilicon photodiode non-epitaxially formed on the sidewall. To make electrical contacts to the photodiode, a portion of the photodiode is formed on an annular horizontal surface 306 that surrounds the mesa.

Illustratively, the photodiode comprises a $SiO_2$ isolation layer 340, a p-type polysilicon layer 345, and an n-type polysilicon layer 350. These layers extend vertically on the sidewall to surface 306 where they then extend laterally on the horizontal surface. Contact 375 for contacting the n-type polysilicon layer and contact 380 for contacting the p-type polysilicon layer are formed on the horizontal portions of the layers.

This preferred embodiment is fabricated by first constructing the VCSEL and then forming the polysilicon photodiode. The fabrication of the VCSEL is well known and is similar to what have been described before, and therefore is not discussed in detail here. After forming VCSEL 310 with a mesa 312 and an exposed annular surface 306, a $SiO_2$ isolation layer is formed by either sputtering or by CVD. Next, p-type and n-type polysilicon layers are deposited and etched to form the structure depicted in FIG. 6.

Figure 7A:
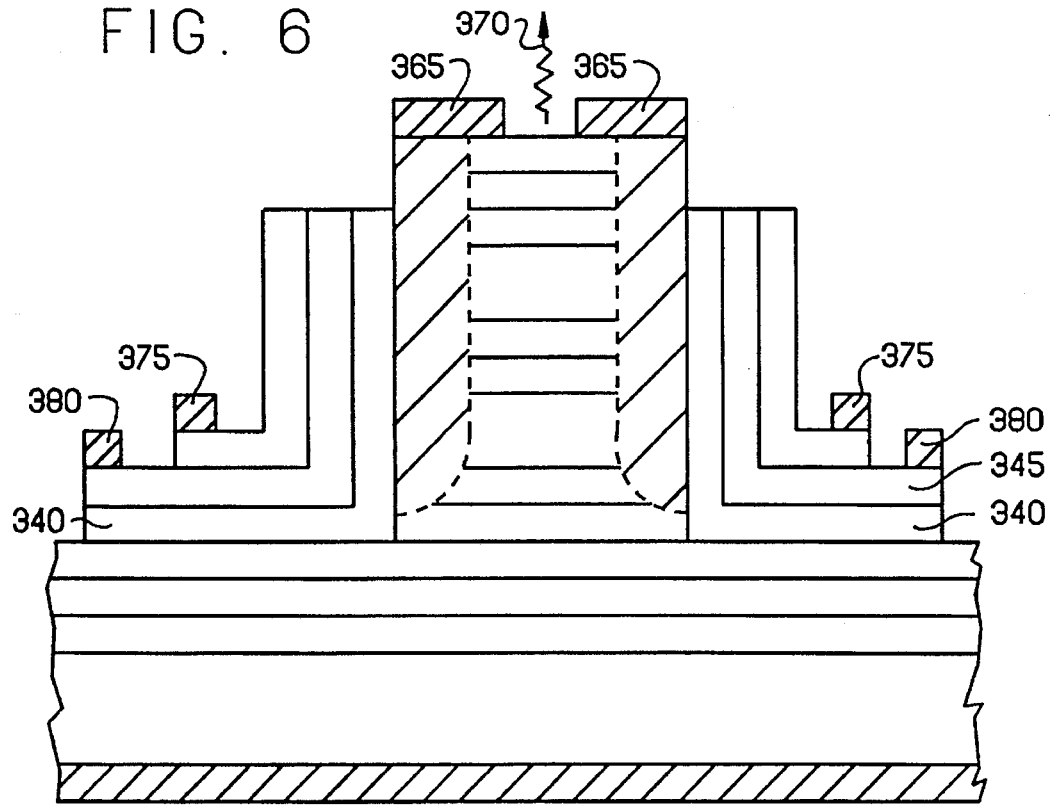
FIGS. 7a and 7b illustrate cross-sectional and top views of an alternative embodiment of the device shown in FIG. 6.
Figure 7B:
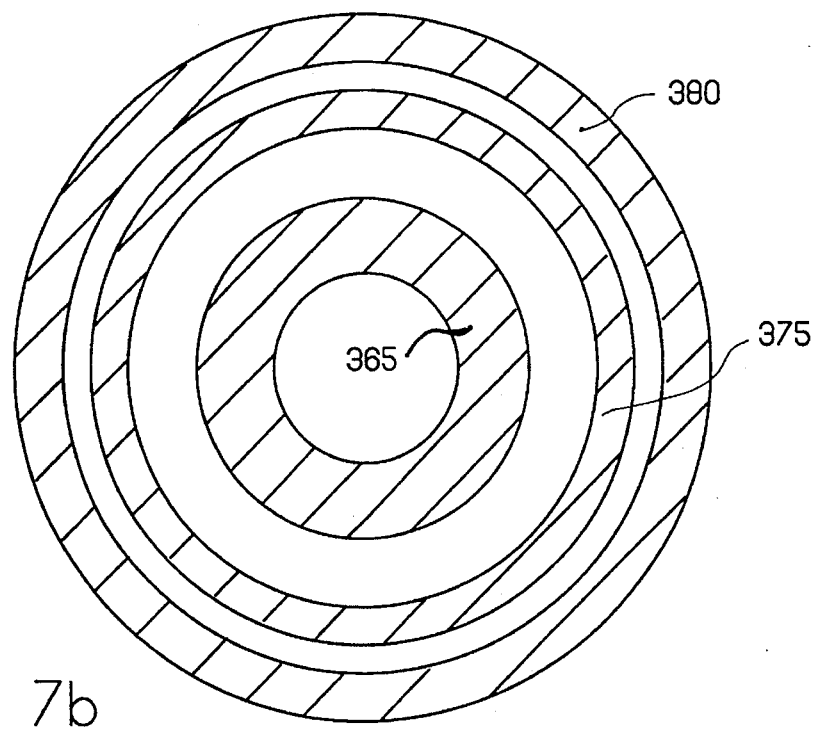

Note that the embodiment shown in FIG. 6 illustrates the PN photodiode formed on a portion of the sidewall. Alternatively, as illustrated in FIGS. 7a and 7b, a ring-shaped PN photodiode is formed to substantially cover the entire sidewall. Illustratively, FIGS. 7a and 7b show the cross-sectional and top views of this embodiment.

In another embodiment of the invention, an integrated optoelectronic device comprises a VCSEL formed on a first surface of a substrate, and an implanted photodiode formed at a second surface and within the substrate. The implanted photodiode intercepts optical radiation emitted from the laser and produces a feedback signal that corresponds to the intensity of the laser radiation.

Figure 8:
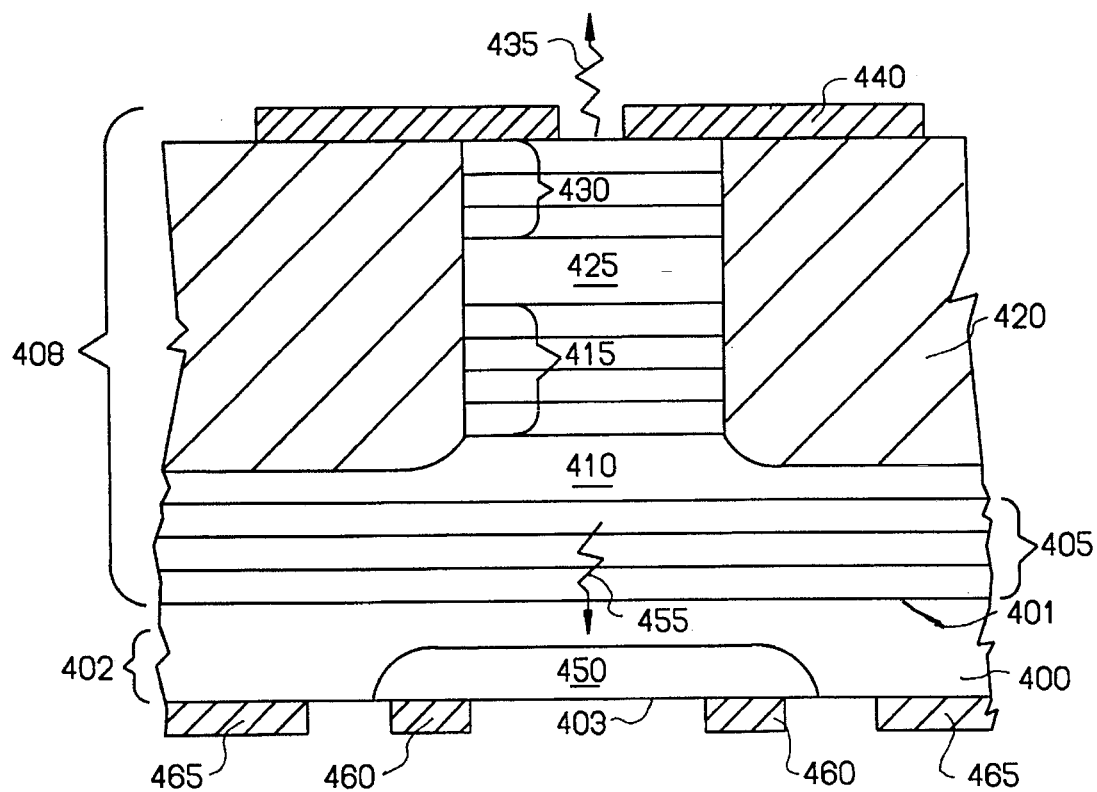
FIG. 8 illustratively shows a cross-section of a VCSEL integrally formed with an implanted PN photodiode.

Specifically, as illustrated in FIG. 8, the preferred embodiment of this device comprises a VCSEL 408 formed on a first surface 401 of a substrate 400, and an implanted PN photodiode 402 formed at a second surface 403 of the substrate. Preferably, the substrate is an n-type GaAs substrate doped to have a doping density of approximate $10^{18}/cm^3$. The VCSEL comprises a first mirror 405 formed on surface 401, a first spacer 410, an active region 415, a second spacer 425, and second mirror 430. The VCSEL further includes a current confinement region 420, an upper contact 440, and a substrate contact 465. Upon applying electrical current between contacts 440 and 465, optical radiation 435 radiates through the second mirror of the VCSEL. Additionally, optical radiation 455 is emitted from the VCSEL toward the implanted photodiode.

Illustratively, first mirror 405 is a semiconductor DBR comprising a plurality of alternating layers of AlGaAs and AlAs, each layer having a thickness of $\lambda/4n$. Preferably, mirror 405 is partially transmissive so that about 10% of the emitted optical radiation is emitted toward the photodiode. The transmissivity of the first mirror can be changed by adjusting the number of layers of AlGaAs and AlAs that form the first mirror. To facilitate current injection to the active region, the first mirror is doped to have n-type conductivity.

Active region 415 comprises at least one InGaAs quantum well. Since InGaAs quantum wells have an effective bandgap less than the bandgap of GaAs, radiation 455 does not suffer significant absorption in the substrate.

Second mirror 430 is a semiconductor DBR comprising a plurality of alternating AlGaAs and AlAs layers, each layer having a thickness of $\lambda/4n$. The mirror is made to be more transmissive than the first mirror so that about 90% of total optical radiation is emitted through the second mirror.

PN photodiode 402 comprises a p-type implanted region 450 formed in the n-type GaAs substrate. The implanted p-type region forms with the n-type GaAs substrate a pn junction which intercepts radiation 455. In addition, contact 460 is formed to contact the p-type implanted region and contact 465 is formed to contact the substrate. When operating, a reverse bias voltage is applied to the pn junction through contacts 460 and 465, which produces a current that corresponds to the intensity of radiation 455.

The fabrication of the VCSEL will be apparent to those skilled in the art, and therefore, is not discussed in detail here. The PN photodiode is formed by ion implantation of p-type conductivity dopant into the n-type substrate. One way to fabricate this device is to first perform ion implantation on the back surface to form the PN photodiode, then to form epitaxial layers for the VCSEL on the front surface of the substrate. A thermal annealing process is usually employed after the implantation to activate the implanted dopants. Alternatively, epitaxial layers for the VCSEL are first grown on the first surface of the substrate, followed by the ion implantation that forms the PN photodiode.

For best signal to noise ratios, the p-type implantation region has a diameter greater than the active region, and is vertically aligned with the active region.

In another embodiment of the invention, an optoelectronic device comprises a lateral injection VCSEL integrally formed with a lateral PIN photodiode. This device includes three implanted regions formed at the periphery of an active region of the laser. The three implanted regions are first and third implanted regions having a first conductivity type, and a second implanted region having a second conductivity type.

The first and third implanted regions facilitate applying current to the active region to generate optical radiation. The third implanted region, the active region, and the second implanted region together form a lateral PIN photodiode wherein the voltage between the second and third implanted regions corresponds to the intensity of the optical radiation.

Figure 9A:
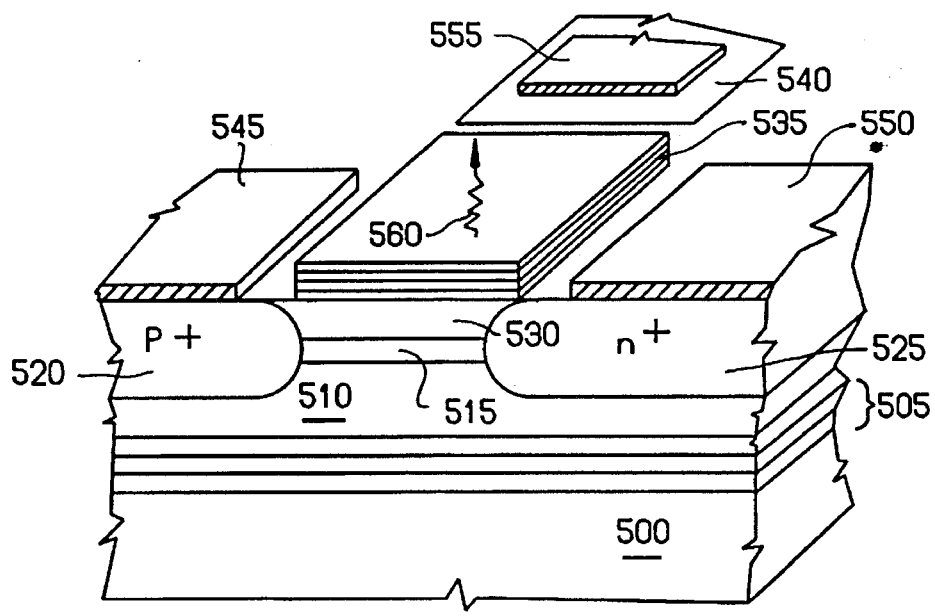
FIGS. 9a–9c depict a cross-sectional view, a top view, and an equivalent circuit diagram, respectively, of a lateral injection VCSEL integrated with a lateral PIN photodiode.

As illustrated in FIG. 9a, a preferred embodiment of this integrated optoelectronic device comprises a GaAs semi-insulating substrate 500, a first mirror 505, a first spacer 510, an active region 515, a second spacer 530, and a second mirror 535. The device further includes a first implanted region 520 having a p-type conductivity, a second implanted region 525 having a n-type conductivity, and a third implanted region 540 have a p-type conductivity.

Additionally, the device also includes contacts 545, 550, and 555 for contacting the first, second, and third implanted regions, respectively.

Figure 9B:
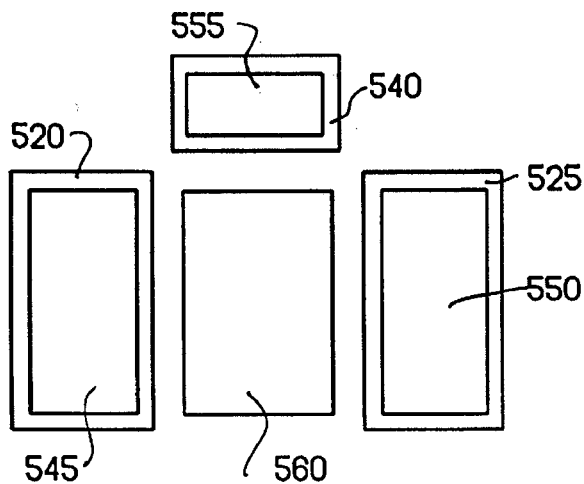

FIG. 9b depicts the top view of this device. Note that same elements are designated with the same numbers as in FIG. 9a.

Preferably, the first mirror is a semiconductor DBR comprising a plurality of alternating AlAs and AlGaAs layers, each of the AlAs and AlGaAs layers having a thickness of $\lambda/4n$. The first mirror is formed on the semi-insulating GaAs substrate and is un-doped.

The active region comprises at least one GaAs quantum well and is interposed between the two spacers. The second mirror is formed on the second spacer. Preferably, the second mirror is a dielectric DBR comprising a plurality of alternating $Si_3N_4$ and $SiO_2$ layers. Each of the $Si_3N_4$ and $SiO_2$ layers that form the second mirror has a thickness equal to $\lambda/4n$.

The first and third implanted regions are both doped with p-type dopants to have a high doping density of $10^{18}/cm^3$. The second implantation region is doped with n-type dopants such as Si. Preferably, the density of n-type dopant in the second implanted region is greater than $10^{18} cm^3$.

Note that the active region, the spacers and the mirrors are all un-doped. Additionally, the three implanted regions do not overlap. Therefore, without any applied bias, the implanted regions are electrically isolated from each other. When a voltage is applied between contacts 545 and 550 in this device, a current flows from the first to the second implanted region through the active region, thereby generating optical radiation 560. The intensity of such radiation is detected by measuring the voltage between contacts 550 and 555.

Figure 9C:
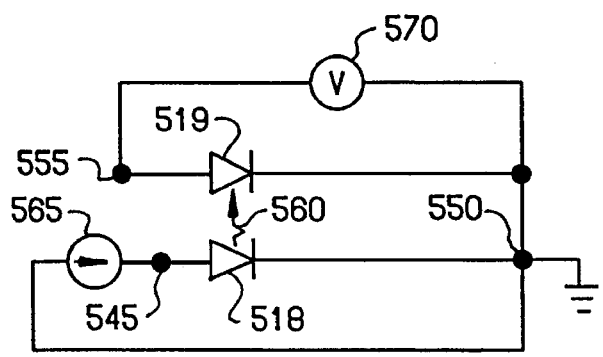

FIG. 9c is a schematic circuit diagram for this device. Illustratively, a current source 565 is used for driving a laser 518 which is the VCSEL described above. A voltmeter 570 is used to measure the voltage across PIN photodiode 519 which corresponds to the voltage between contacts 550 and 555. The voltage of the lateral PIN photodiode is utilized as a feedback signal representative of the VCSEL intensity. An alternative method of applying a reverse bias to the PIN photodiode and measuring the photocurrent of the PIN photodiode is not applicable in this embodiment because the reverse bias undesirable affects the optical radiation of the VCSEL.

This device is formed by first epitaxially growing layers that form the first mirror, the active region and the spacers on a semi-insulating GaAs substrate. Next, a p-type implantation is performed to form implanted regions 520 and 540. This is followed by an n-type implantation that forms implanted region 525. The implanted wafer is then thermally annealed through a rapid thermal anneal process to activate the implanted species. Subsequently, a series of alternating $Si_3N_4$ and $SiO_2$ layers are deposited and etched to form the second mirror. Contacts 545 and 555 for contacting the p-type implanted regions and contact 550 for contacting the n-type implanted region are then formed.

Figure 9D:
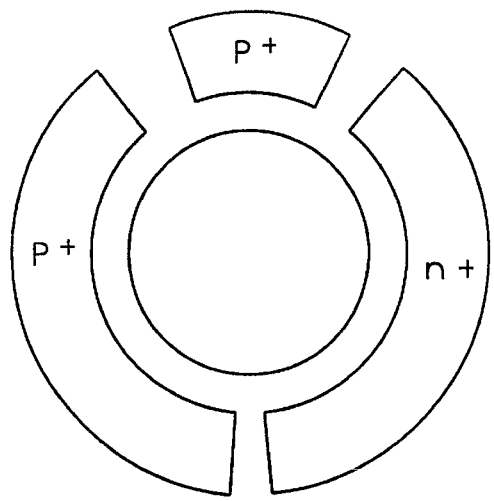

In an alternative to the embodiment shown in FIG. 9b, the active region is circular and the implanted regions are formed around the periphery of the active region as shown in FIG. 9d.

In another alternative embodiment, a fourth implanted region having a second type conductivity is incorporated in the embodiment of FIG. 9a. The top view of this embodiment is shown in FIG. 9e, wherein two implanted regions 550, 556 having n-type conductivity and two implanted regions 520, 555 having p-type conductivity are formed around the active region.

Figure 9E:
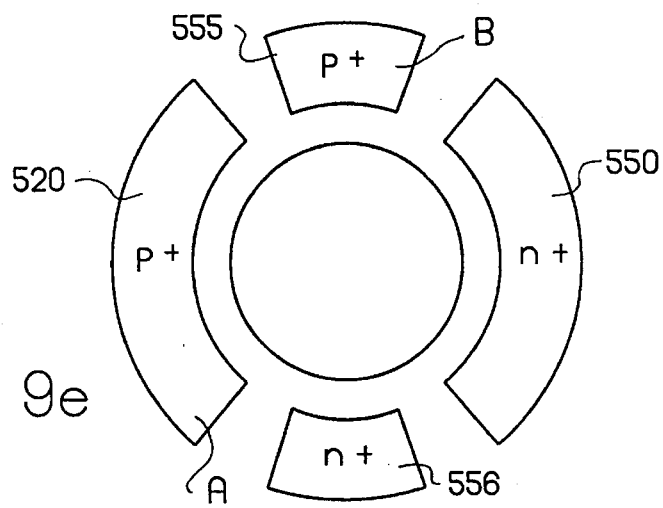
Figures 9F, 9G:
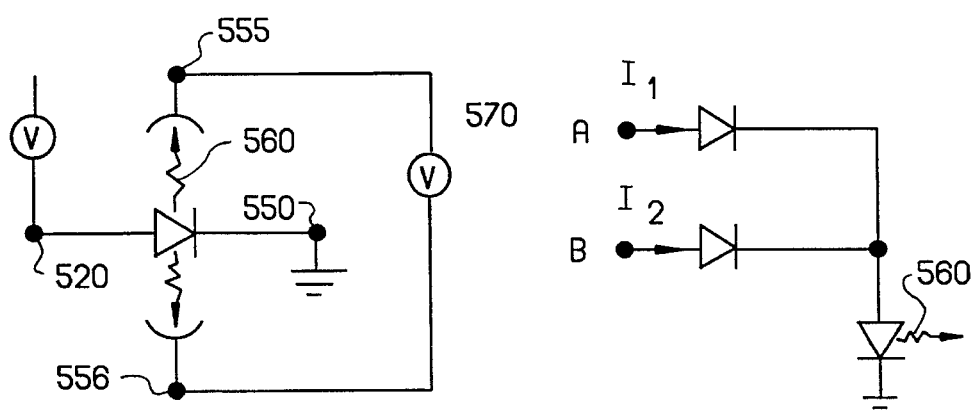
FIG. 9f is a schematic circuit diagram for operating the device shown in FIG. 9e.
FIG. 9g shows an equivalent circuit diagram of another possible circuit configuration using the device shown in FIG. 9e.

FIG. 9f illustrates a circuit diagram for the device shown in FIG. 9e. In this configuration, two implanted regions are utilized for introducing a driving current to the active region of the laser, whereas the other two implanted regions are used to measure the voltage from the PIN photodiode. Thus, applying current from regions 520 to 550 generates optical radiation 560 from the laser, whereas a voltage that corresponds to the intensity of the radiation can be sensed between regions 555 and 556.

FIG. 9g shows the schematic circuit diagram for another application of this device. In this application, the two implanted regions of the same conductivity type are electrically connected to the ground potential. Two currents, $I_1$ and $I_2$ for driving the laser, are applied to other two implanted regions, respectively. In this configuration, the device can be utilized as an electro-optic logic device.

In yet another embodiment of the invention, an integrated optoelectronic device comprises a VCSEL and a vertical photodiode epitaxially formed alongside the VCSEL. The photodiode is a PIN photodiode and is isolated from the VCSEL by a surrounding implanted isolation region.

Figure 10A:
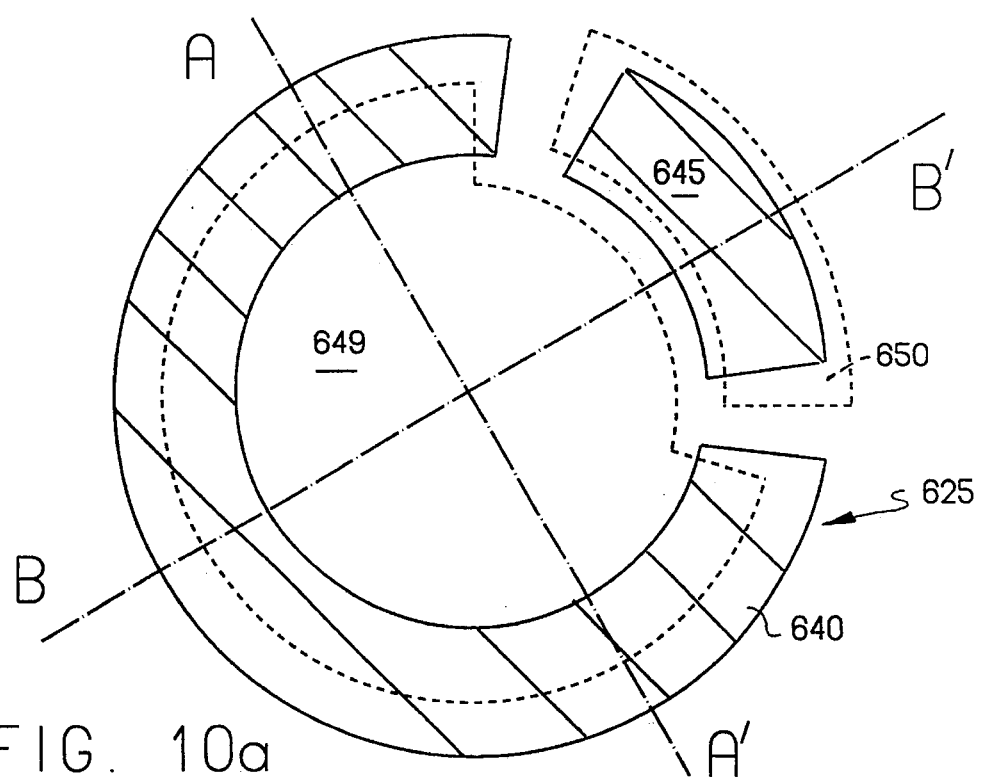
FIG. 10a illustrates a top view of a VCSEL integrated with a PIN photodiode formed alongside of the VCSEL.

FIG. 10a depicts a top view of the preferred embodiment of the device. Illustratively, a dash line enclosed portion 649 is the top of the VCSEL, and another dash line enclosed portion 650 is the top view of the PIN diode. Areas between the dash lines are areas of the implanted isolation region. A contact 640 is formed for contacting the top of the VCSEL, and a contact 645 is formed as the anode contact of the PIN photodiode.

Figure 10B:
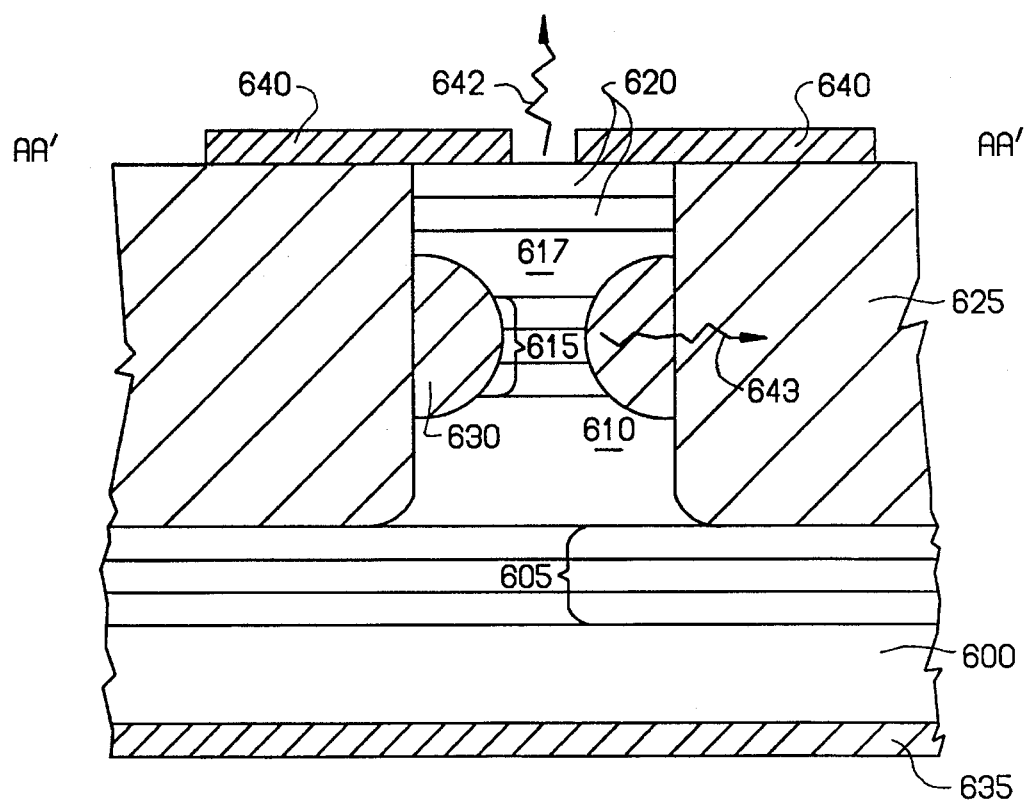

A cross-sectional view of the laser taken along line A–A' of FIG. 10a is illustrated in FIG. 10b. The VCSEL comprises an n-type GaAs substrate 600, a first n-type mirror 605, an un-doped first spacer 610, an un-doped active region 615 comprising at least one InGaAs quantum well, an un-doped second spacer 617, and a p-type second mirror 620. In addition, the VCSEL further includes an implanted isolation region 625 that vertically extends from the second mirror to the first mirror. An annular current confinement region 630 is formed around the active region. By applying a current between contacts 640 and 635, an optical radiation 642 is vertically emitted from the VCSEL. Additionally, the VCSEL emits a lateral optical radiation 643. Typically, the intensity of the lateral radiation 643 is much lower than the vertical radiation 642.

Figure 10C:
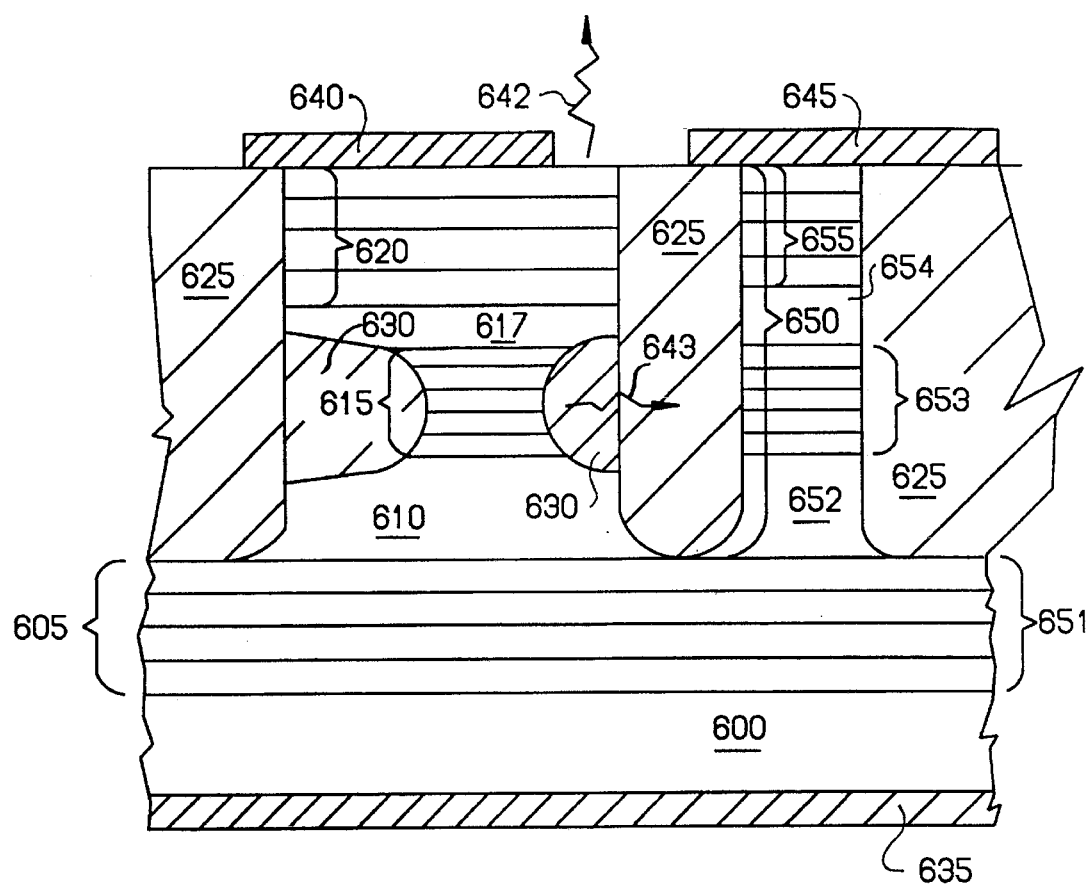

FIG. 10c depicts a cross-sectional view taken from B–B' axis of FIG. 10a. This figure shows a cross-section of the VCSEL as well as the PIN photodiode. Illustratively, PIN photodiode 650 is formed alongside VCSEL to receive lateral optical radiation 643, and it contains the same epitaxial layers as the VCSEL. Specifically, the PIN photodiode comprises n-type layers 651, un-doped layers 652 and 654, and p-type layer 655. Layers 651, 652, 653, 654 and 655 are portions of the same epitaxial layers that form the first mirror, the first spacer, the active region, the second spacer, and the second mirror of the VCSEL, respectively. The PIN photodiode is vertically surrounded by isolation region 625. A contact 645 is formed on the PIN photodiode to contact p-type layers 655.

Figure 10D:
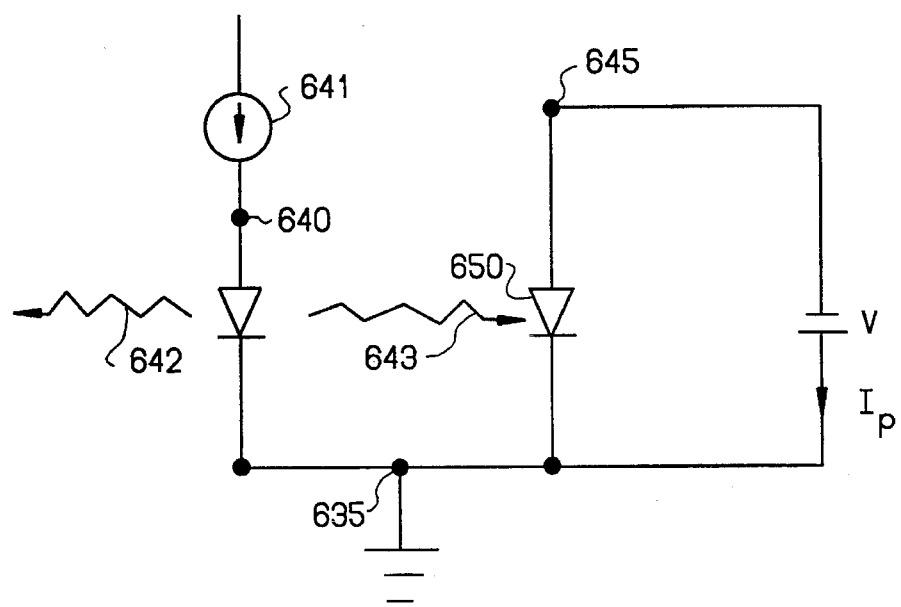

FIG. 10d illustrates the schematic circuit diagram of the use of this device to detect laser intensity. Illustratively, a current source 641 is applied to laser contact 640 to drive the laser to emit radiation 642 along the vertical axis of the laser and radiation 643 in the lateral direction. PIN photodiode 650 is reversed biased by a voltage V. The PIN photodiode receives the lateral optical radiation and generates a photocurrent $I_P$ which corresponds to the intensity of radiation 642.

In the preferred embodiment, the first mirror 605 is an n-type semiconductor DBR made from a plurality of alternating AlGaAs and AlAs layers, each having a thickness of $\lambda/4n$. Preferably, spacers 610 and 617 are un-doped AlGaAs layers. The active region 615 contains at least one InGaAs quantum well and has an effective bandgap energy less than GaAs. Second mirror 620 is a p-type semiconductor DBR consisting of a plurality of alternating AlGaAs and AlAs layers, each having a thickness of $\lambda/4n$. Isolation region 625 is a region implanted with Ar and has high resistivity. The annular current confinement region is also an Ar-implanted region peripherally formed around the active region.

This integrated optoelectronic device is fabricated using conventional known and well-developed technologies. First, epitaxial layers forming the mirrors, spacers, and active region are grown on an n-type GaAs substrate. Next, the isolation region is defined by photolithography and ion-implantation of Ar ions. Subsequently, another Ar-implantation is performed to form the annular current confinement region. Following the two ion implantation, a rapid thermal annealing process is employed to reduce the damage caused by the implantation. Subsequently, anode contacts for the laser and the PIN photodiode and a contact for the GaAs substrate are formed.

As will be apparent to those skilled in the art, numerous other embodiments of the invention can be devised. In particular, it should be noted that the invention may also be practical using superluminescent light emitting diodes (SLEDs) in place of VCSELS. The SLEDs may have the same structure as the VCSELs but be driven by currents below their threshold currents, or wherein the mirrors of the VCSELs are not efficient enough to produce a substantially stimulated optical radiation, i.e. laser radiation. Alternatively, all or part of one of the mirror structures may be eliminated so that lasing cannot occur.

What is claimed is:

1. An integrated optoelectronic device comprising:
   a substrate;
   a surface light emitting device formed on the substrate, the surface light emitting device emitting optical radiation through an optical aperture;
   a photodiode formed on the surface light emitting device with an isolation layer therebetween;
   wherein the photodiode comprises materials having an energy bandgap equal to or smaller than the energy of the optical radiation, the photodiode intercepting an amount of the optical radiation sufficient to monitor optical output power of the surface light emitting device; and
   wherein the photodiode generates an electrical signal proportional to the optical output power.

2. An integrated optoelectronic device comprising:
   a substrate;
   a surface light emitting device formed on the substrate, the surface light emitting device emitting optical radiation through an optical aperture;
   a photodiode formed on the surface light emitting device with an isolation layer therebetween;
   wherein the photodiode comprising materials having an energy bandgap equal to or smaller than the energy of the optical radiation, the photodiode intercepting a portion of the optical radiation and generating a corresponding electrical signal; and
   wherein the photodiode is a PN photodiode comprising a P-type layer formed on the isolation layer and an N-type layer formed on the P-type layer, the P-type layer forming the anode of the PN photodiode.

3. The device of claim 2 wherein the P-type and N-type layers of the PN photodiode comprise polysilicon; and wherein contacts to the PN photodiode do not substantially impinge on the optical aperture of the surface light emitting device.

4. An integrated optoelectronic device comprising:
   a substrate;
   a surface light emitting device formed on the substrate, the surface light emitting device emitting optical radiation through an optical aperture;
   a photodiode formed on the surface light emitting device with an isolation layer therebetween;
   wherein the photodiode comprising materials having an energy bandgap equal to or smaller than the energy of the optical radiation, the photodiode intercepting a portion of the optical radiation and generating a corresponding electrical signal; and
   wherein the surface light emitting diode comprises a first distributed Bragg reflector formed on the substrate and an active region formed on the reflector for generating the optical radiation formed over the reflector.

5. An integrated optoelectronic device comprising:
   a substrate;
   a surface light emitting device formed on the substrate, the surface light emitting device emitting optical radiation through an optical aperture;
   a photodiode formed on the surface light emitting device with an isolation layer therebetween;
   wherein the photodiode comprising materials having an energy bandgap equal to or smaller than the energy of the optical radiation, the photodiode intercepting a portion of the optical radiation and generating a corresponding electrical signal;
   wherein the surface light emitting device is a vertical cavity surface emitting laser (VCSEL) comprising a first mirror formed on the substrate, a second mirror parallel to the first mirror and forming with the first mirror an optical cavity, and an active region disposed between the mirrors, at least a first portion of the second mirror forming an anode of the VCSEL; and
   wherein the photodiode is a PN photodiode comprising a P-type layer formed on the isolation layer and an N-type layer formed on the P-type layer, the P-type layer forming an anode of the PN photodiode, the isolation layer formed between the anode of the VCSEL and the anode of the PN photodiode.

6. The device of claim 5 wherein a second portion of the second mirror acts as the isolation layer between the VCSEL anode and the PN photodiode anode.

7. The device of claim 5 wherein contacts to the PN photodiode does not substantially impinge on the optical aperture of the VCSEL.

8. The device of claim 5 wherein the isolation layer comprises $SiO_2$.

9. The device of claim 6 wherein the second mirror is a Bragg reflector, the second portion of the Bragg reflector comprising a plurality of alternating dielectric layers of high and low indices of refraction.

10. The device of claim 9 wherein the alternating dielectric layers are $SiO_2$ and $Si_3N_4$ layers.

11. The device of claim 9 wherein the anode of the PN photodiode is accessed by a contact between the P-type layer of the PN photodiode and a top one of the alternating dielectric layers.

12. An integrated optoelectronic device comprising:
a substrate having first and second opposing planar surfaces;
a surface light emitting device formed on the first surface of the substrate, the surface light emitting device emitting optical radiation through an optical aperture; and
a photodiode formed on the second surface of the substrate, the photodiode being aligned with the surface light emitting device to receive a portion of the emitted optical radiation which has traversed the substrate, the photodiode generating an electrical signal in response thereto.

13. The device of claim 12 wherein the surface light emitting device is a vertical cavity surface emitting laser (VCSEL) comprising a first mirror formed on the first surface of the substrate, a second mirror parallel to the first mirror and forming with the first mirror an optical cavity and an active region disposed between the mirrors; and wherein the first mirror is partially transmissive and the radiation has a wavelength corresponding to an energy bandgap that not greater than that of the substrate.

14. The device of claim 13 wherein the photodiode is formed on an isolation layer interposed between the photodiode and the second surface of the substrate.

15. The device of claim 14 wherein the photodiode is a polysilicon PN photodiode comprising a P-type layer of polysilicon formed on the P-type layer and an N-type layer of polysilicon formed on the first layer.

* * * * *